(12) United States Patent
Tian et al.

(10) Patent No.: US 10,741,691 B2
(45) Date of Patent: Aug. 11, 2020

(54) ARRAY SUBSTRATE, DISPLAY PANEL AND DISPLAY DEVICE

(71) Applicants: Beijing BOE Optoelectronics Technology Co., Ltd., Beijing (CN); BOE Technology Group Co., Ltd., Beijing (CN)

(72) Inventors: Lu Tian, Beijing (CN); Jingang Hao, Beijing (CN); Dongsheng Huang, Beijing (CN); Huibo Zhang, Beijing (CN); Pengqu Zhang, Beijing (CN); Shuai Yan, Beijing (CN); Guocui Meng, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/329,026

(22) PCT Filed: Apr. 23, 2018

(86) PCT No.: PCT/CN2018/084107
§ 371 (c)(1),
(2) Date: Feb. 27, 2019

(87) PCT Pub. No.: WO2018/223784
PCT Pub. Date: Dec. 13, 2018

(65) Prior Publication Data
US 2019/0207036 A1 Jul. 4, 2019

(30) Foreign Application Priority Data
Jun. 9, 2017 (CN) .......................... 2017 1 0432950

(51) Int. Cl.
*H01L 27/14* (2006.01)
*H01L 29/786* (2006.01)
(Continued)

(52) U.S. Cl.
CPC .. *H01L 29/78618* (2013.01); *G02F 1/136286* (2013.01); *H01L 27/124* (2013.01);
(Continued)

(58) Field of Classification Search
CPC ............... H01L 27/1222; H01L 27/124; H01L 27/1255; H01L 29/78618
(Continued)

(56) References Cited

U.S. PATENT DOCUMENTS 6,191,831 B1    2/2001 Kim et al.
6,654,074 B1 *  11/2003 Ha .................... G02F 1/1309
                                                     349/40
(Continued)

FOREIGN PATENT DOCUMENTS

CN    103715203 A    4/2014
CN    104505391 A    4/2015
(Continued)

OTHER PUBLICATIONS

International Search Report dated Jul. 25, 2018 issued in corresponding International Application No. PCT/2018/084107.
(Continued)

*Primary Examiner* — Tan N Tran
(74) *Attorney, Agent, or Firm* — Nath, Goldberg & Meyer; Joshua B. Goldberg; Stephanie F. Majkut

(57) ABSTRACT

The present disclosure provides an array substrate, a display panel and a display device. The array substrate includes a base substrate and a thin film transistor. An orthographic projection of a drain of the thin film transistor on the base
(Continued)

substrate does not go beyond an orthographic projection of a gate of the thin film transistor on the base substrate.

9 Claims, 2 Drawing Sheets

(51) Int. Cl.
    *H01L 27/12*      (2006.01)
    *H01L 29/08*      (2006.01)
    *G02F 1/1362*      (2006.01)
    *G02F 1/1343*      (2006.01)
    *G02F 1/1368*      (2006.01)

(52) U.S. Cl.
    CPC ...... *H01L 27/1222* (2013.01); *H01L 27/1255* (2013.01); *H01L 29/0847* (2013.01); *G02F 1/1368* (2013.01); *G02F 1/134363* (2013.01); *G02F 1/136227* (2013.01); *H01L 29/78696* (2013.01)

(58) Field of Classification Search
    USPC ........................................... 257/59, 72, 432
    See application file for complete search history.

(56) References Cited

U.S. PATENT DOCUMENTS

| | | | |
|---|---|---|---|
| 7,916,224 B2 * | 3/2011 | Chung | ............ G02F 1/136213 349/38 |
| 9,196,698 B2 * | 11/2015 | Fukase | .................. H01L 29/511 |
| 9,406,701 B2 | 8/2016 | Xu | |
| 9,515,091 B2 * | 12/2016 | Hwang | ............... H01L 27/1214 |
| 9,583,512 B2 | 2/2017 | Lou et al. | |
| 2019/0207036 A1 | 7/2019 | Tian et al. | |

FOREIGN PATENT DOCUMENTS

| | | | |
|---|---|---|---|
| CN | 106169483 A | | 11/2016 |
| CN | 106405951 | * | 2/2017 |
| CN | 106405951 A | | 2/2017 |
| CN | 206178305 U | | 5/2017 |
| CN | 107065361 A | | 8/2017 |

OTHER PUBLICATIONS

Office Action dated Nov. 6, 2018 issued in corresponding Chinese Application No. 201710432950.5.
Office Action dated May 27, 2019 issued in corresponding Chinese Application No. 201710432950.5.

* cited by examiner

ARRAY SUBSTRATE, DISPLAY PANEL AND DISPLAY DEVICE

CROSS-REFERENCE TO RELATED APPLICATION

This is a National Phase Application filed under 35 U.S.C. 371 as a national stage of PCT/CN2018/084107, filed on Apr. 23, 2018, an application claiming the benefit of priority to Chinese Patent Application No. 201710432950.5 filed on Jun. 9, 2017, the contents of which are incorporated herein in their entirety by reference.

TECHNICAL FIELD

The present disclosure relates to the field of display technology, and in particular, to an array substrate, a display panel including the array substrate, and a display device including the display panel.

BACKGROUND

Display devices such as liquid crystal display devices and organic light emitting diode display devices have been widely used. The liquid crystal display device and the organic light emitting diode display device use thin film transistors (TFTs) to control pixels in the display panel.

SUMMARY

As an aspect of the present disclosure, there is provided an array substrate, including a base substrate and a thin film transistor, and an orthographic projection of a drain of the thin film transistor on the base substrate is within an orthographic projection of a gate of the thin film transistor on the base substrate.

In some embodiments, a length of the drain along an extending direction of a data line is smaller than a length of the gate along the extending direction of the data line.

In some embodiments, the length of the drain along the extending direction of the data line is between 7 μm and 12 μm, and the length of the gate along the extending direction of the data line is between 10 μm and 15 μm.

In some embodiments, a source of the thin film transistor is a part of a corresponding data line.

In some embodiments, the thin film transistor is a bottom gate type thin film transistor.

In some embodiments, in the thin film transistor, an orthographic projection of an active layer on the base substrate is a trapezoid, a portion of the active layer including a lower base of the trapezoid is connected to the source, and a portion of the active layer including an upper base of the trapezoid is connected to the drain.

In some embodiments, the array substrate further includes a gate pattern layer, an active pattern layer, and a source and drain pattern layer, wherein the gate pattern layer includes a plurality of gate lines, the source and drain pattern layer includes a plurality of data lines, the plurality of gate lines and the plurality of data lines are disposed to intersect with each other to divide the array substrate into a plurality of pixel units, the thin film transistor is disposed in the pixel unit, the gate pattern layer further includes the gate of the thin film transistor, the source and drain pattern layer further includes a source and the drain of the thin film transistor, and the active pattern layer includes an active layer of the thin film transistor.

In some embodiments, the array substrate further includes a pixel electrode layer and an insulating passivation layer covering the source and drain pattern layer, the pixel electrode layer includes a plurality of pixel electrodes, and each of the plurality of pixel units is provided with one pixel electrode electrically connected to a corresponding drain through a via hole penetrating through the insulating passivation layer.

As a second aspect of the present disclosure, there is provided a display panel, including an array substrate, wherein the array substrate is the above array substrate provided by the present disclosure.

As a third aspect of the present disclosure, there is provided a display device including a display panel, wherein the display panel is the above display panel provided by the present disclosure.

BRIEF DESCRIPTION OF THE DRAWINGS

The accompanying drawings, which serve to provide a further understanding of the present disclosure and constitute a part of this specification, are used for explaining the present disclosure together with the following specific implementations, rather than limiting the present disclosure. In the drawings.

DETAILED DESCRIPTION

Specific implementations of the present disclosure will be described in detail below in conjunction with the accompanying drawings. It should be understood that, the specific implementations described herein are merely used for describing and explaining the present disclosure, rather than limiting the present disclosure.

Figure 1:
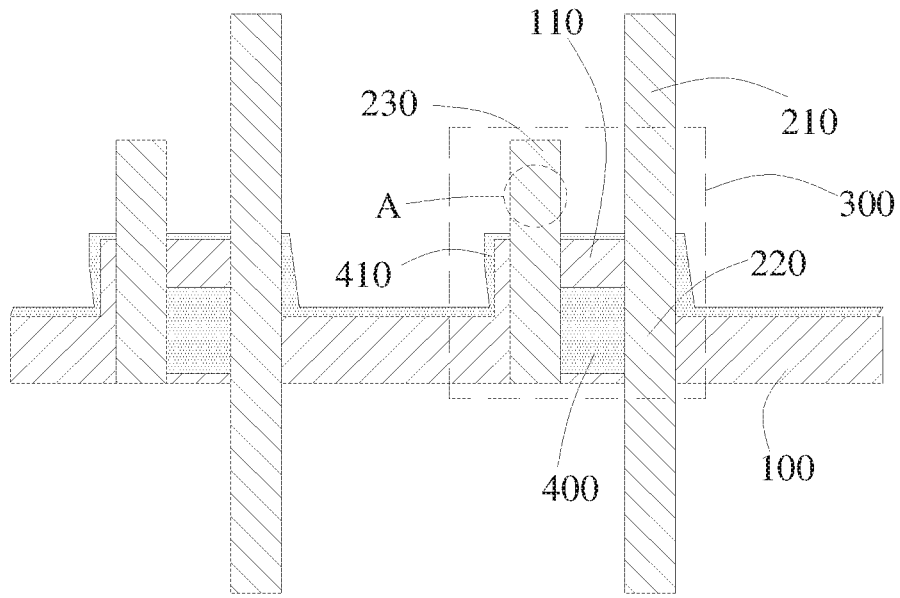
FIG. 1 is a schematic diagram of a portion of a conventional array substrate.

A display device typically includes an array substrate. FIG. 1 is a schematic diagram of a portion of a conventional array substrate. The array substrate includes a base substrate, a gate pattern layer, an active pattern layer, and a source and drain pattern layer. The gate pattern layer includes a plurality of gate lines 100, and the source and drain pattern layer includes a plurality of data lines 210. The plurality of gate lines 100 and the plurality of data lines 210 are disposed to intersect with each other to divide the array substrate into a plurality of pixel units. The array substrate further includes a thin film transistor 300 disposed in the pixel unit, the gate pattern layer further includes a gate 110 of the thin film transistor, the source and drain pattern layer further includes a source 220 and a drain 230 of the thin film transistor, and the active pattern layer includes an active layer 400 of the thin film transistor. In order to ensure that there is sufficient space to provide a via hole connected to a pixel electrode, the size of the drain is usually made relatively large, but in this case, the source and the drain are easily short-circuited.

The inventors have found that the array substrate shown in FIG. 1 is prone to display failure. This is because, after the active pattern layer is formed, a residual material 410 of the active layer material is easily formed at the edge of the gate line 100 of the array substrate. Since the residual material 410 is formed at the edge of the gate line 100, the residual material cannot be discovered by in-process PI monitoring.

In order to ensure sufficient space for providing the via hole (in the embodiment shown in FIG. 1, the via hole is disposed at the dotted circle A), the size of the drain 230 of the thin film transistor 300 is set to be relatively large, and as shown in FIG. 1, the drain 230 extends upward to the exterior of the gate 110. In this case, the residual material 410 is connected between the source 220 and the drain 230. When a display device including the array substrate is operated to display, the residual material 410 at the edge of the gate line 100 can also connect the source 220 with the drain 230, thereby causing display failure.

Figure 2:
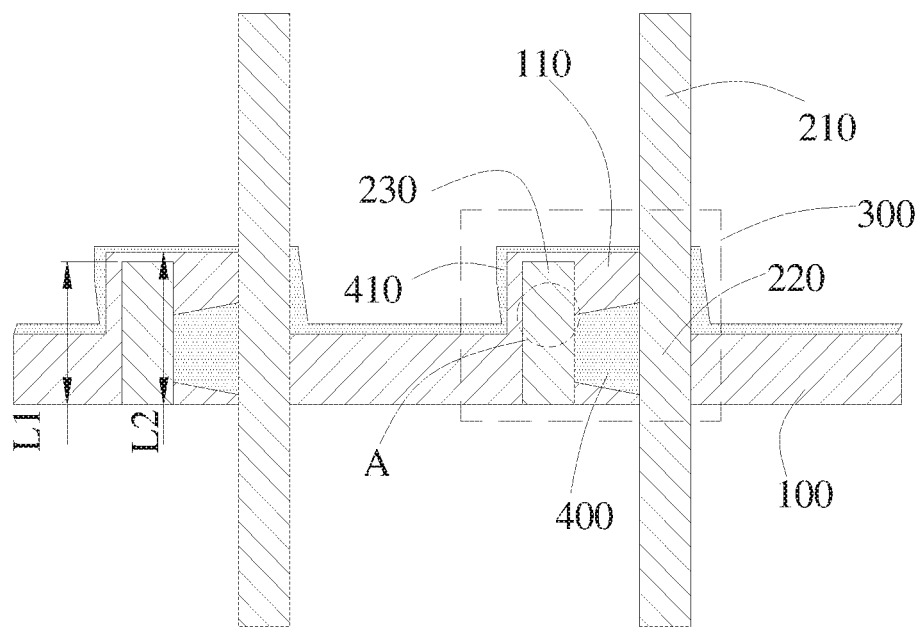
FIG. 2 is a schematic diagram of a portion of an array substrate according to an embodiment of the present disclosure.

In view of the above problems, as an aspect of the present disclosure, an array substrate is provided. FIG. 2 is a schematic diagram of a portion of an array substrate according to an embodiment of the present disclosure. The array substrate includes a base substrate, a gate pattern layer, an active pattern layer, and a source and drain pattern layer. As shown in FIG. 2, the gate pattern layer includes a plurality of gate lines 100, and the source and drain pattern layer includes a plurality of data lines 210. The plurality of gate lines 100 and the plurality of data lines 210 are disposed to intersect with each other to divide the array substrate into a plurality of pixel units. The array substrate further includes a thin film transistor 300 disposed in the pixel unit, the gate pattern layer further includes a gate 110 of the thin film transistor, and the source and drain pattern layer further includes a source 220 and a drain 230 of the thin film transistor, and the active pattern layer includes an active layer 400 of the thin film transistor. An orthographic projection of the drain 230 of the thin film transistor on the base substrate does not go beyond an orthographic projection of the gate 110 of the thin film transistor on the base substrate.

As shown in FIG. 2, since the orthographic projection of the drain 230 on the base substrate is within the orthographic projection of the gate 110 on the base substrate, the residual material, if any, of the active layer material at the edge of the gate line 100 cannot connect the source 220 with the drain 230. Therefore, when the display device including the array substrate is operated to display, display failure due to short-circuiting between the source 220 and the drain 230 will not occur. In this way, the display effect of the display panel including the array substrate can be improved.

In the present disclosure, the sizes of the gate 110 and the drain 230 are not particularly limited. In order to ensure that there is sufficient space on the drain 230 to form a via hole connected to the pixel electrode (as shown in FIG. 2, the via hole is formed at the dotted circle A), in some embodiments, a length L1 of the drain 230 in an extending direction of the data line 210 is between 7 μm to 12 μm, and a length L2 of the gate 110 in the extending direction of the data line 210 is between 10 μm to 15 μm. It should be noted that the length L1 of the drain 230 in the extending direction of the data line 210 is smaller than the length L2 of the gate 110 in the extending direction of the data line 210.

Needless to say, the present disclosure is not limited thereto. The sizes of the gate 110 and the drain 230 may be set such that the length L1 of the drain 230 in the extending direction of the data line 210 is smaller than the length L2 of the gate 110 in the extending direction of the data line 210, and the size of the gate 110 and the size of the drain 230 are within the critical dimension (CD) range.

In the present disclosure, the structure of the source 220 is not particularly limited as long as the source 220 can receive the data signal from the data line 210. For example, the source 220 may protrude from the data line. In order to simplify the mask for forming the source and drain pattern layer, in some embodiments, and as shown in FIG. 2, the source 220 of the thin film transistor is a part of the corresponding data line 210.

It can be easily understood that the thin film transistors 300 of a same column correspond to a same data line 210.

The structure provided by the present disclosure is particularly suitable for a bottom gate type thin film transistor. In some embodiments, the thin film transistor in the array substrate is a bottom gate type thin film transistor. In this case, the gate pattern layer is located between the active pattern layer and the base substrate.

It can be easily understood by those skilled in the art that a gate insulating layer may be disposed between the gate pattern layer and the active pattern layer.

In order to increase the aperture ratio of the array substrate, in some embodiments, and as shown in FIG. 2, in at least one thin film transistor 300, the orthographic projection of the active layer 400 on the base substrate is a trapezoid, a portion, whose orthographic projection on the base substrate includes a lower base of the trapezoid, of the active layer 400 is connected to the source 220, and a portion, whose orthographic projection on the base substrate includes an upper base of the trapezoid, of the active layer 400 is connected to the drain 230.

The active layer having a trapezoidal shape can reduce the area of the gate while ensuring a sufficient channel size, so that the aperture ratio can be increased.

Generally, the array substrate includes a common electrode 500 and a pixel electrode 600. One pixel electrode is disposed in each pixel unit. The common electrode is electrically connected to a common electrode line, and a common voltage is supplied to the common electrode through the common electrode line. The pixel electrode is electrically connected to the drain of the thin film transistor, and a data voltage is supplied to the thin film transistor through the drain.

In order to form a storage capacitor, the common electrode 500 and the pixel electrode 700 are insulated and spaced apart from each other. In the present disclosure, the positions of the common electrode and the pixel electrode are not particularly limited. For example, the common electrode may be disposed between the pixel electrode and the base substrate, or the pixel electrode may be disposed between the common electrode and the base substrate.

Figure 3:
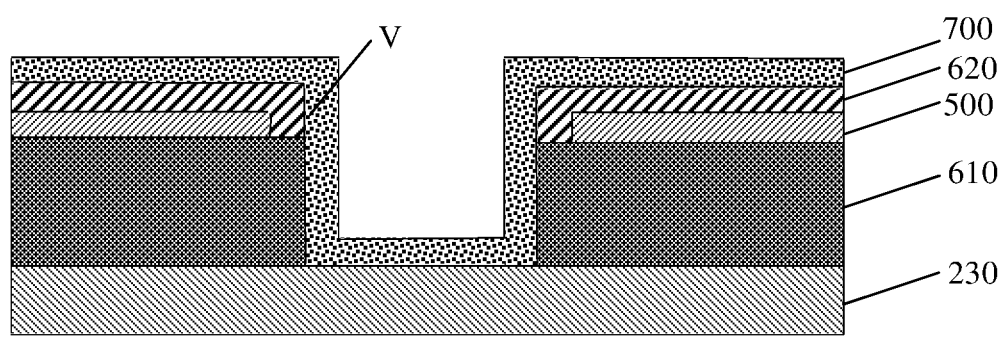
FIG. 3 is a schematic diagram of a portion of an array substrate according to an embodiment of the present disclosure.

In one example, the common electrode is disposed between the pixel electrode and the base substrate. In an embodiment, the array substrate includes an insulating passivation layer (e.g., a first passivation layer 610 and a second passivation layer 620 shown in FIG. 3) covering the source and drain pattern layer. As shown in FIG. 3. the array substrate further includes a pixel electrode layer, the pixel electrode layer includes a plurality of pixel electrodes, each of the plurality of pixel units is provided therein with one of the plurality of pixel electrodes 700, and the pixel electrode is electrically connected to a corresponding drain 230 through a via hole V penetrating through the insulating passivation layer.

As a second aspect of the present disclosure, there is provided a display panel including an array substrate, and the array substrate is the above-described array substrate provided by the present disclosure.

In the thin film transistor of the array substrate, there is no residual active layer material between the source and the drain, so when the display panel is operated to display, display failure caused by short-circuiting between the source and the drain will not occur.

In an embodiment of the present disclosure, the display panel is a liquid crystal display panel. The display panel includes the above-described array substrate, a counter substrate opposite to the array substrate, and liquid crystal material filled between the array substrate and the counter substrate.

In some embodiments, a color filter layer may be disposed on the counter substrate to achieve color display. Needless to say, the color filter layer may be disposed on the array substrate.

In an embodiment of the present disclosure, the display panel is an electrochromic display panel including the above-described array substrate, a counter substrate opposite to the array substrate, and an electrochromic material disposed between the array substrate and the counter substrate.

As a third aspect of the present disclosure, there is provided a display device including a display panel, and the display panel is the above-described display panel provided by the present disclosure.

As described above, in the display device, display failure caused by short-circuiting between the source and the drain due to residual material of the active layer at the edge of the gate line will not occur.

It can be easily understood that the display device may be a liquid crystal display device.

In some embodiments, the display device may further include a backlight for providing a light source for the display panel.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. An array substrate comprising a base substrate, a gate pattern layer, an active layer pattern, and source and drain pattern layers, wherein the gate pattern layer comprises a plurality of gate lines, the source and drain pattern layers comprise a plurality of data lines, the plurality of gate lines and the plurality of data lines are disposed to intersect with each other to divide the array substrate into a plurality of pixel units, the array substrate further comprises a thin film transistor disposed in the pixel unit, the gate pattern layer further comprises a gate of the thin film transistor, the source and drain pattern layers further comprise a source and a drain of the thin film transistor, and the active pattern layer comprises an active layer of the thin film transistor, wherein an orthographic projection of the drain of the thin film transistor on the base substrate is within an orthographic projection of the gate of the thin film transistor on the base substrate, the source of the thin film transistor is part of a corresponding data line, and the thin film transistor is a bottom gate type thin film transistor, and in the thin film transistor, an orthographic projection of the active layer on the base substrate is a trapezoid, a lower base of the trapezoid is connected to the source, and an upper base of the trapezoid is connected to the drain.

2. The array substrate of claim 1, wherein a length of the drain along an extending direction of a data line is smaller than a length of the gate along the extending direction of the data line.

3. The array substrate of claim 1, wherein a length of the drain along an extending direction of a data line is between 7 μm and 12 μm, and a length of the gate along the extending direction of the data line is between 10 μm and 15 μm.

4. The array substrate of claim 1, further comprising a pixel electrode layer and an insulating passivation layer covering the source and drain pattern layer, wherein the pixel electrode layer comprises a plurality of pixel electrodes, and each of the plurality of the pixel units is provided with one pixel electrode electrically connected to a corresponding drain through a via hole penetrating through the insulating passivation layer.

5. A display panel comprising an array substrate, wherein the array substrate is the array substrate of claim 1.

6. The display panel of claim 5, wherein a length of the drain along an extending direction of a data line is smaller than a length of the gate along the extending direction of the data line.

7. The display panel of claim 5, wherein a length of the drain along an extending direction of a data line is between 7 μm and 12 μm, and a length of the gate along the extending direction of the data line is between 10 μm and 15 μm.

8. The display panel of claim 5, wherein the thin film transistor further comprises a pixel electrode layer and an insulating passivation layer covering the source and drain pattern layer, the pixel electrode layer comprises a plurality of pixel electrodes, and each of the plurality of the pixel units is provided with one pixel electrode electrically connected to a corresponding drain through a via hole penetrating through the insulating passivation layer.

9. A display device comprising a display panel, wherein the display panel is the display panel of claim 5.

* * * * *